(12) United States Patent
Huang et al.

(10) Patent No.: US 7,482,956 B2
(45) Date of Patent: Jan. 27, 2009

(54) CALIBRATION APPARATUS FOR MISMATCHES OF TIME-INTERLEAVED ANALOG-TO-DIGITAL CONVERTER

(75) Inventors: Fong-Ching Huang, Hsinchu (TW); Cheng-Chung Hsu, Hsinchu (TW)

(73) Assignee: Realtek Semiconductor Corp., Hsinchu (TW)

( * ) Notice: Subject to any disclaimer, the term of this patent is extended or adjusted under 35 U.S.C. 154(b) by 9 days.

(21) Appl. No.: 11/701,466

(22) Filed: Feb. 2, 2007

(65) Prior Publication Data

US 2008/0024338 A1      Jan. 31, 2008

(30) Foreign Application Priority Data

Jul. 27, 2006    (TW) .............................. 95127425 A (51) Int. Cl.
*H03M 1/12* (2006.01)
(52) U.S. Cl. ...................... 341/120; 341/155
(58) Field of Classification Search ................ 341/118, 341/120, 155
See application file for complete search history.

(56) References Cited

U.S. PATENT DOCUMENTS

| 4,763,105 | A |  | 8/1988 | Jenq |  |
|---|---|---|---|---|---|
| 5,294,926 | A |  | 3/1994 | Corcoran |  |
| 6,522,282 | B1 | * | 2/2003 | Elbornsson | ................. 341/155 |
| 7,039,540 | B1 | * | 5/2006 | Dahle et al. | ................. 702/108 |
| 7,250,885 | B1 | * | 7/2007 | Nairn | ......................... 341/155 |
| 2002/0122503 | A1 | * | 9/2002 | Agazzi | ....................... 375/316 |
| 2007/0133719 | A1 | * | 6/2007 | Agazzi et al. | ............... 375/341 |

OTHER PUBLICATIONS

Dyer et al. An Analog Background Calibrartion Technique for Time-Interleaved Analog-to-Digital Converters, IEEE Journal of Solid-State Circuits vol. 33 No. 12 Dec. 1998 pp. 1912-1919.*
Dyer et al. A Digital Background Calibrartion Technique for Time-Interleaved Analog-to-Digital Converters, IEEE Journal of Solid-State Circuits vol. 33 No. 12 Dec. 1998 pp. 1904-1911.*
Elbornsson et al., Blind Adaptive Equalization of Mismatch Errors in a Time-Interleaved A/D Converter System, IEEE Transactions on Circuits and Systems, vol. 51, No. 1 Jan. 2004 pp. 151-158.*
Jamal et al., A 10-b 120-Msample/s Time-Interleaved Analog-to-Digital Converter with Digital Background Calibration, IEEE Journal of Solid-State Circuits, vol. 37, No. 12, Dec. 2002.*
Luna et al., "Compensation of Track and Hold Frequency Response Mismatches in Interleaved Analog to Digital Converters for High-Speed Communications." IEEE (2006), pp. 1631-1634.
Haftbaradaran et al., "Mismatch Compensation Techniques Using Random Data for Time-Interleaved A/D Converters." IEEE. (2006) pp. 3402-3405.
Hadidi et al., "A Highly Linear Cascode-Driver CMOS Source-Follower Buffer," ICECS (1996), pp. 1243-1246.

* cited by examiner

*Primary Examiner*—Howard Williams
(74) *Attorney, Agent, or Firm*—Muncy, Geissler, Olds & Lowe PLLC (57) ABSTRACT

A calibration device for calibrating an ADC comprising: an error estimator for estimating an error of a digital signal outputted from the ADC, the error estimator includes: a digital filter for filtering the digital signal to generate a filtered signal; and a least-mean-square module for performing a least-mean-square operation according to the filtered signal to generate an estimated error; and an error correction module for correcting the digital signal according to the estimated error.

25 Claims, 8 Drawing Sheets

CALIBRATION APPARATUS FOR MISMATCHES OF TIME-INTERLEAVED ANALOG-TO-DIGITAL CONVERTER

CROSS-REFERENCE TO RELATED APPLICATIONS

This application is related to the following pending patent applications: Ser. No. 11/164,491, filed Nov. 25, 2005, entitled "Receiver Capable of Correcting Mismatch of Time-Interleaved Parallel ADC and Method Thereof"; and Ser. No. 11/279,556, filed Apr. 12, 2006, entitled "Estimation Circuit for Time-Interleaved ADC and Method Thereof", which application is hereby incorporated herein by reference.

BACKGROUND OF THE INVENTION

1. Field of the Invention

The present invention relates to an analog-to-digital converter, and more particularly, to a time-interleaved analog-to-digital converter.

2. Description of the Related Art

Figure 1:
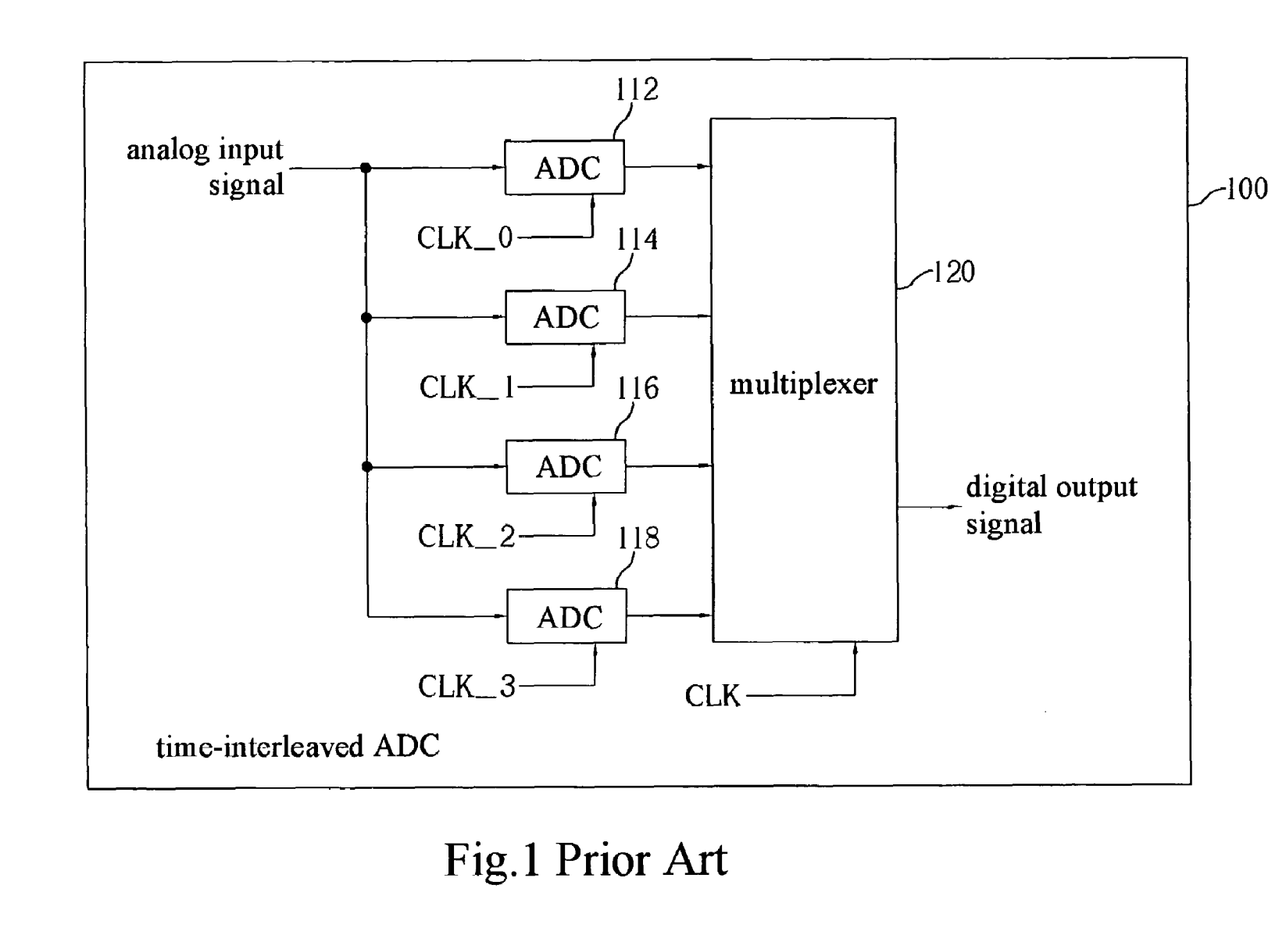
FIG. 1 is a block diagram of a conventional time-interleaved analog-to-digital converter with four sub-ADCs.

Please refer to FIG. 1, which is a block diagram of a conventional time-interleaved analog-to-digital converter with four sub-ADCs module 100. The time-interleaved analog-to-digital converter with four sub-ADCs 100 comprises: four sample-and-hold circuits (not shown in FIG. 1) and four sub-analog-to-digital converters 112, 114, 116, and 118. In general, due to the variances of the manufacturing process, each of the sub-analog-to-digital converters 112, 114, 116, and 118 may have mismatches among them. And the mismatches among the converters 112, 114, 116, and 118 may influence the effective-number-of-bits (ENOB) of the time-interleaved A/D converter 100.

SUMMARY OF THE INVENTION

In view of the above-mentioned problems, an object of the invention is to provide a time-interleaved A/D converter, capable of estimating and calibrating the offset errors and gain errors among the inner converters.

According to an embodiment of the present invention, a calibration device for calibrating an analog-to-digital converter is disclosed. The calibration device comprises: an error estimating module comprising: a filter, receiving at least one digital signal relative to the analog-to-digital converter, for filtering the digital signal to generate a filtered signal; and a least-mean-square module, coupled to the filter, for performing a least-mean-square operation on the filtered signal to generate an estimated error corresponding to the digital signal; and an error correction module, coupled to the error estimating module, for calibrating the error of the analog-to-digital converter according to the estimated error.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 2:
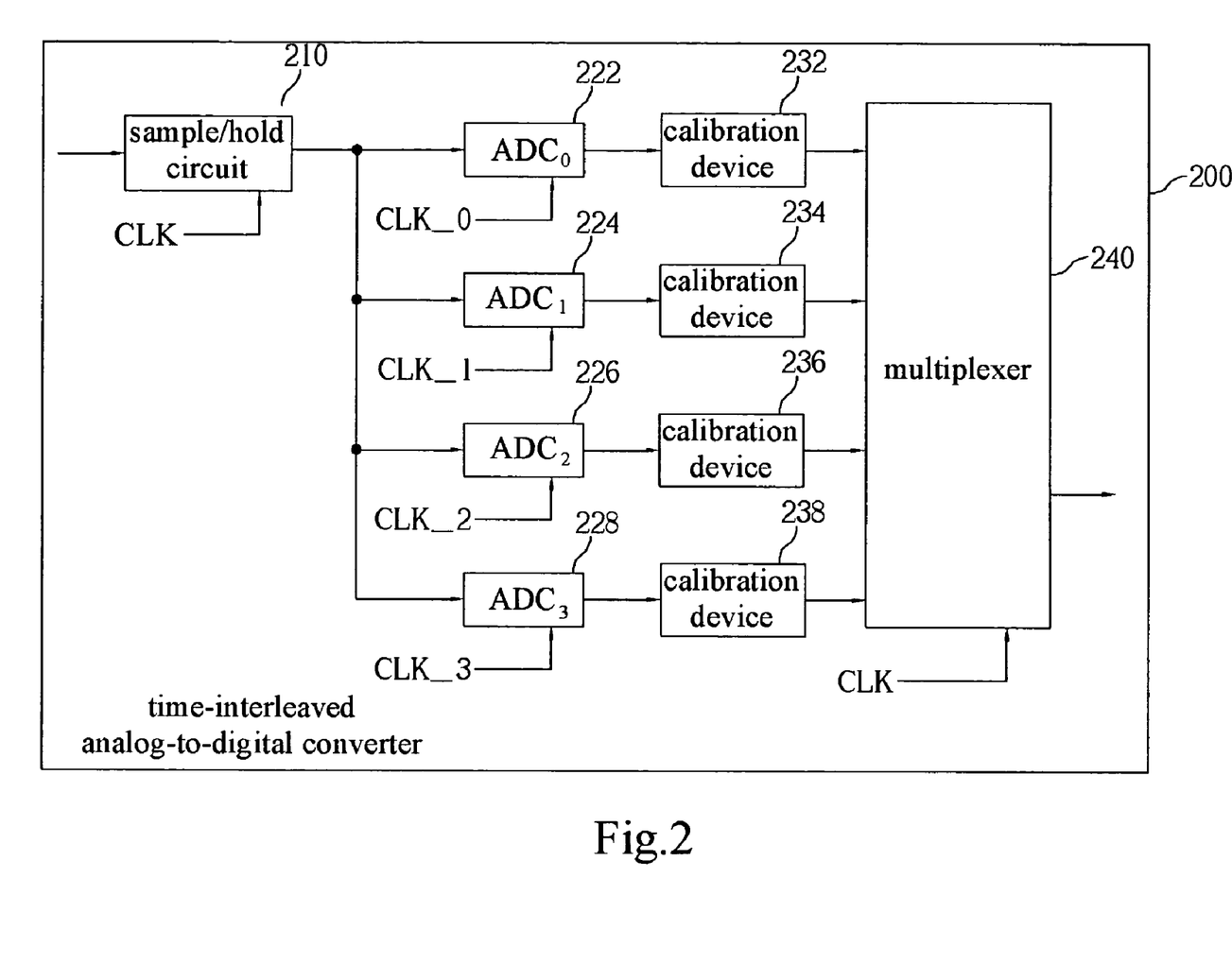
FIG. 2 is a block diagram of a time-interleaved analog-to-digital converter with four sub-ADCs according to an embodiment of the present invention.

Please refer to FIG. 2, which is a block diagram of a time-interleaved analog-to-digital converter with four sub-ADCs 200 according to an embodiment of the present invention. As shown in FIG. 2, the time-interleaved analog-to-digital converter with 4 sub-ADCs 200 comprises a sample-hold circuit 210, a plurality of analog-to-digital converters 222, 224, 226, and 228 (respectively presented by $ADC_0$, $ADC_1$, $ADC_2$ and $ADC_3$), a plurality of calibration devices 232, 234, 236, and 238, and a multiplexer 240. Please note that, the electrical connections among these devices are shown in FIG. 2, and thus omitted here.

In this embodiment, the sample-hold circuit 210 samples the analog input signal by the clock signal CLK with sampling rate F, and maintains the sampled voltage. Accordingly, the sampled voltage will be transmitted to the $ADC_0$, $ADC_1$, $ADC_2$ and $ADC_3$ to perform the operation of converting analog signal to digital signal, wherein the $ADC_0$, $ADC_1$, $ADC_2$ and $ADC_3$ respectively operate according to different clocks CLK_0-CLK_3 (the frequency of each clock is F/4, but the phase of each clock is respectively corresponding to 0, 90, 180, 270 degrees). After converting analog signal to digital signal by $ADC_0$, $ADC_1$, $ADC_2$ and $ADC_3$, the calibration devices 232, 234, 236, 238 will calibrate the output values (could comprising gain error and the offset error) of $ADC_0$, $ADC_1$, $ADC_2$ and $ADC_3$. Finally, the multiplexer 240 will selectively output the calibrated data from calibration devices 232, 234, 236, 238 according to the clock signal CLK with sampling rate F.

In this embodiment, the calibration devices 232, 234, 236, and 238 can calibrate and align the gain error and the offset error among analog-to-digital converters $ADC_0$, $ADC_1$, $ADC_2$ and $ADC_3$ to be the same. For example, the gain/offset error of analog-to-digital converters $ADC_0$, $ADC_1$, $ADC_2$ and $ADC_3$ can be calibrated to 0. Or the gain/offset error of analog-to-digital converters $ADC_1$, $ADC_2$ and $ADC_3$ can be calibrated and aligned to the gain/offset values of $ADC_0$. Any alignment method, which could remove mismatches among ADCs could be adopted. In the second calibration method, the calibration device 232 can be simplified to an accumulating and averaging module without least-mean-square module and error correction module because the gain/offset values of $ADC_0$ need not to be calibrated.

Figure 3:
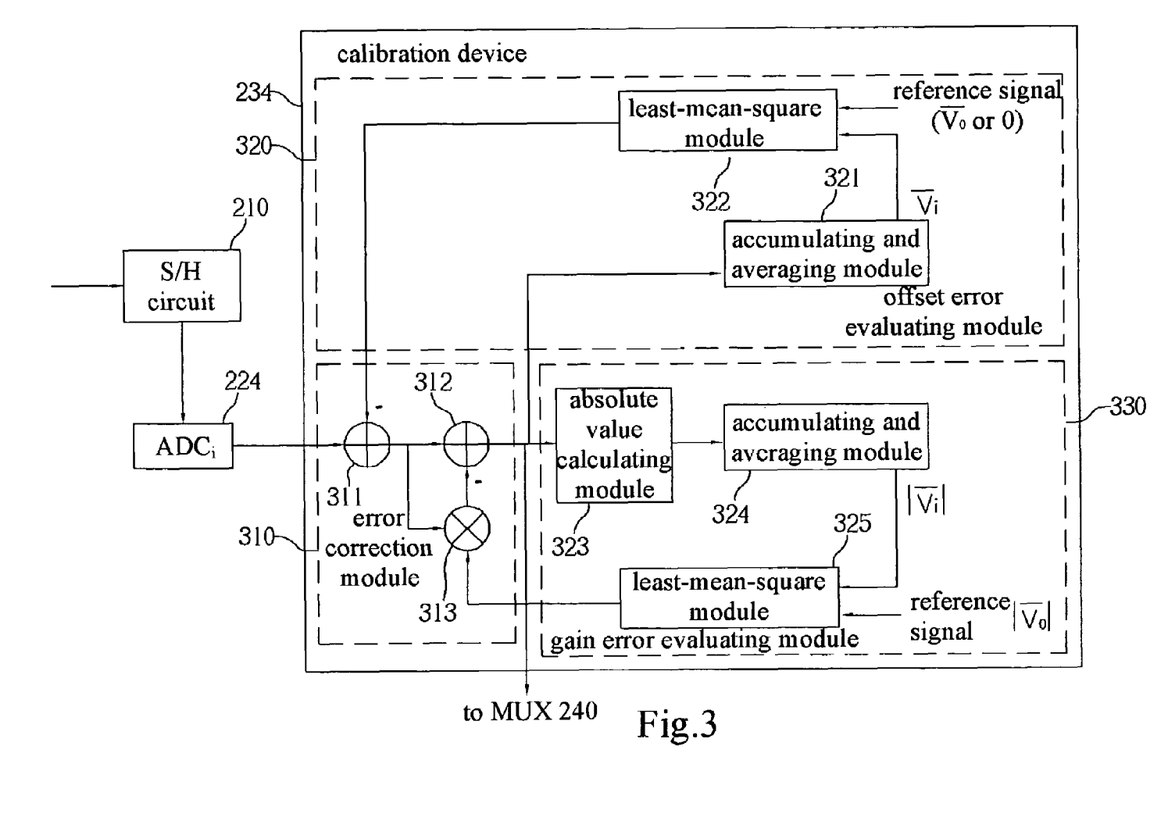
FIG. 3 is a block diagram of an embodiment of the calibration device shown in FIG. 2.

Please refer to FIG. 3, which is a block diagram of an embodiment of the calibration device 234 shown in FIG. 2. As shown in FIG. 3, the calibration device is used to calibrate the error of $ADC_i$ ($ADC_i$ is any one of the $ADC_0$-$ADC_3$, but here taking i=1 to be an embodiment for description). The calibration device comprises an error correction module 310 and an error estimating module. The error correction module 310 is used to correct the output value of the $ADC_1$ by some arithmetic unit according to the estimated error estimated from the error estimating module. In this embodiment, the error estimating module comprises an offset error estimating module 320 and a gain error estimating module 330, wherein the offset error estimating module 320 is used to estimate the offset error of the $ADC_1$, and the gain error estimating module 330 is used to estimate the gain error of the $ADC_1$. Furthermore, the error correction module 310 comprises adder 311, adder 312, and a multiplier 313, where the adder 311 is utilized to remove the offset error of $ADC_1$, the multiplier 313 is utilized to perform the multiplication of the signal outputted from adder 311 and the estimated gain error outputted from gain error estimating module 330, and the adder 312 is utilized to remove the gain error of $ADC_1$. Finally, the calibrated data outputted from adder 312 will be transmitted to the multiplexer 240.

Please refer to the offset error estimating module 320 shown in FIG. 3, the offset error estimating module 320 comprises an accumulating and averaging module 321 and a least-mean-square module 322. The accumulating and averaging module 321 is utilized to calculate one average value (or mean value) for each L samples signal block outputted by the ADC1 as estimating and tracking the DC value of the $ADC_1$, wherein the L is greater than or equal to 1. After estimating the DC value from L samples signal of $ADC_1$, accumulating and averaging module 321 will output one estimated DC values signal $\overline{Vi}$ (where i=1 in this embodiment). In other words, the operation of accumulating and averaging module 321 is like a filter for filtering out the DC value of $ADC_1$ for each L samples signal block. On the other hand, the least-mean-square module 322 is utilized to estimate the offset error of $ADC_1$ by the least-mean-square algorithm. And it has the feature that utilizing the DC value of $ADC_1$ and a reference signal ($\overline{V_0}$ or ground voltage 0) to estimate the residue offset error of $ADC_1$. The more detail description about accumulating and averaging module 321 and least-mean-square module 322 will be introduced in following.

Figure 4:
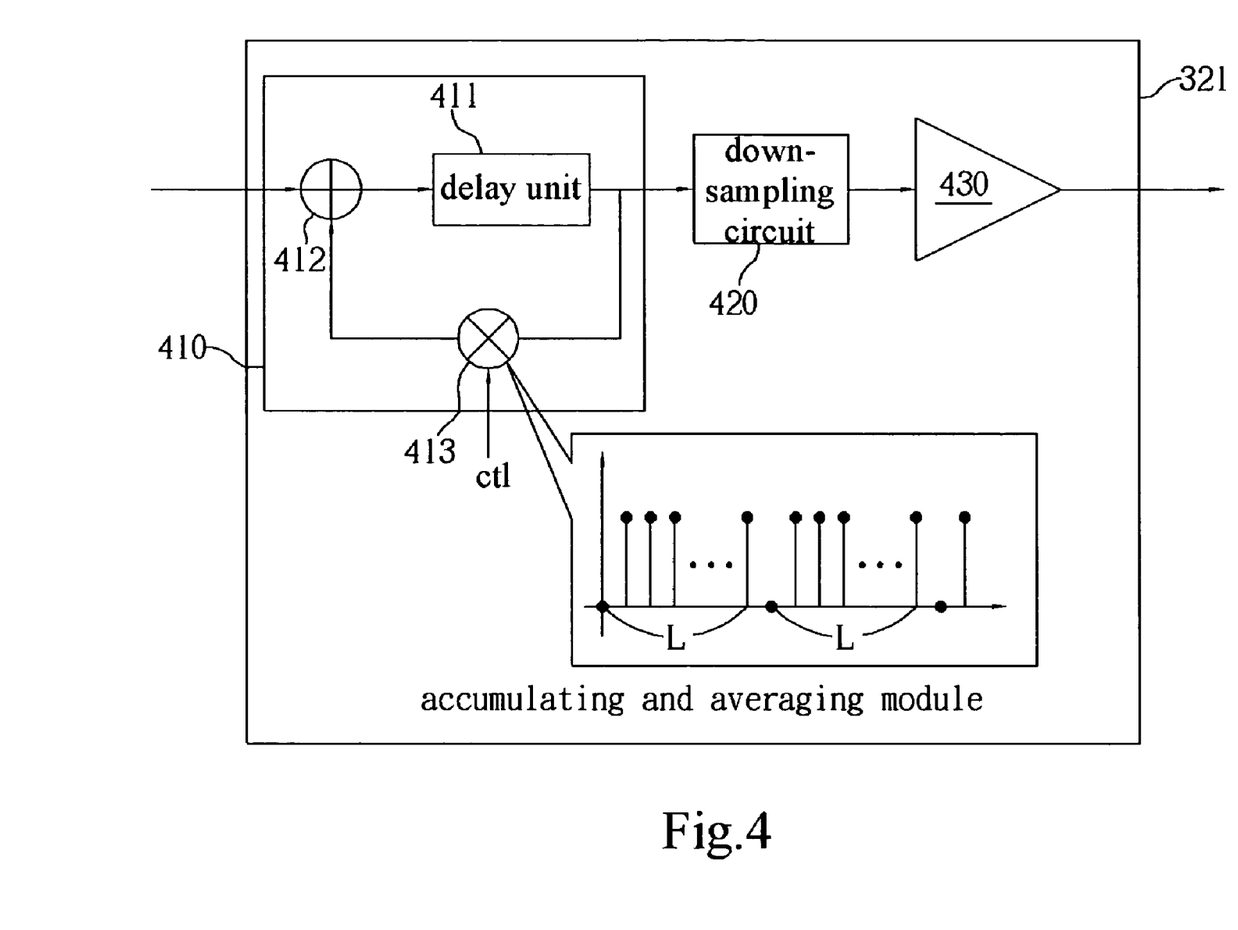
FIG. 4 is a diagram of an embodiment of the accumulating and averaging module shown in FIG. 3.

Please refer to FIG. 4, which is a diagram of an embodiment of the accumulating and averaging module 321 shown in FIG. 3. As shown in FIG. 4, the accumulating and averaging module 321 comprises an accumulator 410, a down-sampling circuit 420, and an averaging module 430. And the accumulator 410 further comprises a delay unit 411 and an adder 412. From the diagram of accumulator 410, it can be realized that when the signal passing through the delay unit 411, the device would feedback the output signal of delay unit 411 to the adder 412 for performing the accumulation. Meanwhile, the multiplier 413 including the control signal ct1 is used to determine whether the output signal of delay unit 411 is feedback to adder 412 or not, that means, when the control signal is set to one, the output signal of delay unit 411 will be added into adder 412 for performing the accumulation; and when the control signal ct1 is set to zero, the output signal of delay unit 411 will not be added into adder 412 but generating a zero value to adder 412. Therefore, it is clear that the function of multiplier 413 is like a switch for determining whether passing previously accumulated value to adder 412 or not. According to this embodiment, after the adder 412 accumulates L samples signal and output one accumulated result, the control signal ct1 will be set to zero for entering next L samples signal accumulation. Thereto, the down-sampling circuit 420 is used to sample the accumulated value of L samples signal. In other words, after the accumulator 410 accumulates one L samples signal block, the down-sampling circuit 420 will sample one accumulated result outputted by delay unit 411. Accordingly, the averaging module 430 (for example, a dividing circuit) averages the accumulated value of L samples signal to obtain the average value $\overline{Vi}$ (where i=1 in this embodiment) for each L sampled signal block of the $ADC_1$.

Please note that, in the above disclosure, the structure of the accumulating and averaging module 321 is only regarded as an embodiment, not a limitation of the present invention. In the actual implementation, because the operation of above-mentioned accumulating and averaging module 321 is substantially equal to a low-pass filtering operation in the frequency domain, the accumulating and averaging module 321 can be replaced by various of digital low-pass filters to calculate the average value of $ADC_1$ output. In addition, the down-sampling circuit 420 is an optional circuit. That means, the accumulating and averaging module 321 can normally work without the down-sampling circuit 420. These relevant changes also obey the spirit of the present invention.

Figure 5:
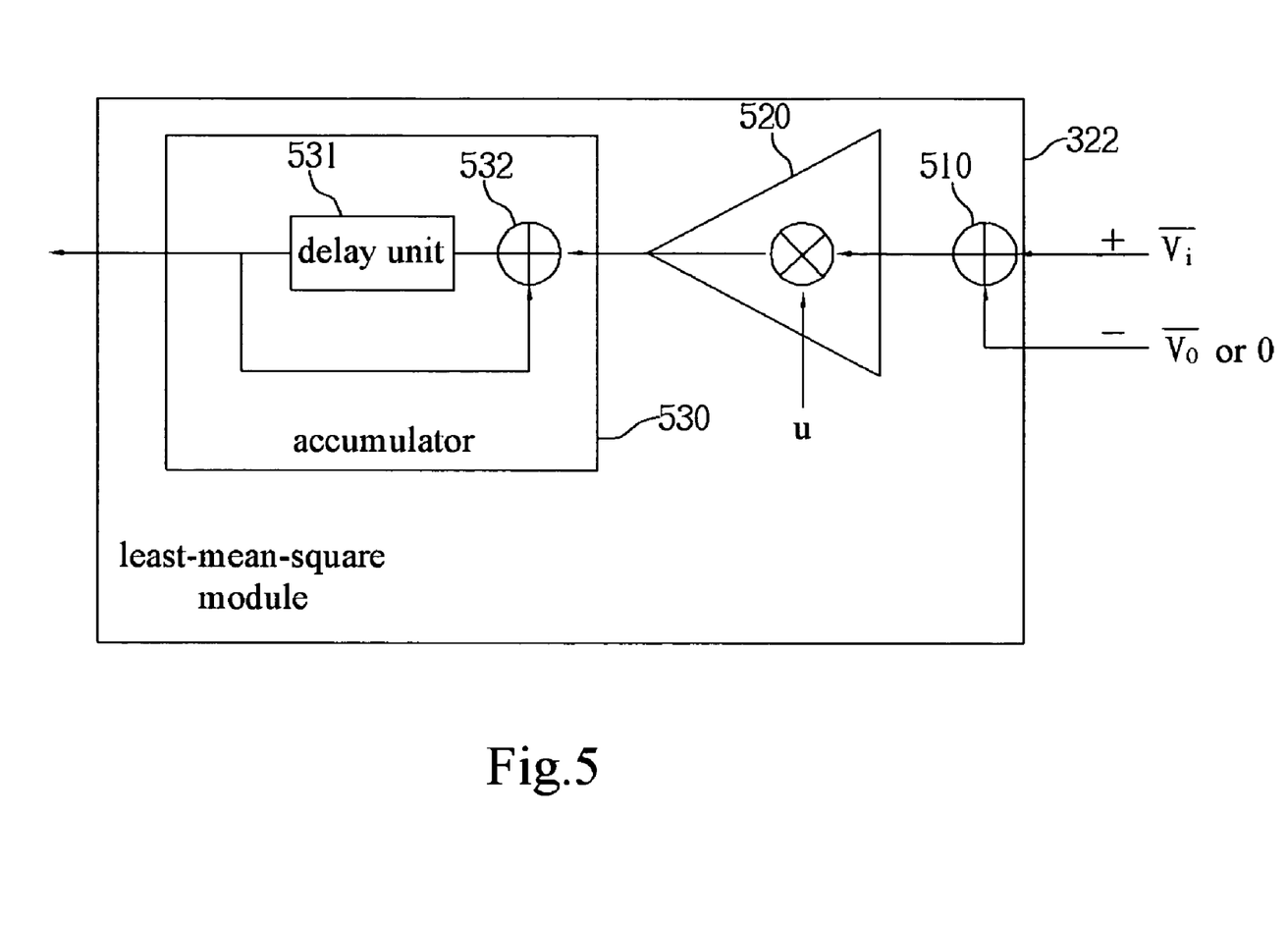
FIG. 5 is a diagram of an embodiment of a least-mean-square module shown in FIG. 3.

Please refer to FIG. 5, which is a diagram of an embodiment of the least-mean-square module 322. As shown in FIG. 5, the least-mean-square module 322 comprises an adder 510 (or subtractor), a step size control unit 520, and an accumulator 530. The least-mean-square module 322 is a feedback circuit for estimating the offset error of $ADC_i$ according to the average value $\overline{Vi}$ and reference signal ($\overline{V_0}$ or ground voltage 0 if input signal is DC-free signal). Please note that, in this embodiment, i=1, and $\overline{V_0}$ is the average value of $ADC_0$ output for one L samples signal block, which is calculated by accumulating and averaging module in calibration device 232. However, the characteristic of the least-mean-square module 322 is to estimate the residue offset error ($\overline{Vi}$-$\overline{V_0}$) by adder 510, and then add the residue offset error into previous estimated offset error by accumulator 530. After a period of time, the estimated offset error of $ADC_1$ stored in the accumulator 530 (at the time of $\overline{Vi}$=$\overline{V_0}$) will approach the true offset error of $ADC_1$. Accordingly, the output value of $ADC_1$ containing the offset error can be calibrated by adder 311, that is, subtracting the estimated offset error from the output value of $ADC_1$ and then generating a calibrated value without offset error. Therefore, when the reference signal is the average value $\overline{V_0}$ of $ADC_0$, the respectively offset errors of $ADC_1$, $ADC_2$ and $ADC_3$ will be the same as the offset value of the $ADC_0$. And when the reference signal is a ground voltage, the respectively offset errors of the four $ADC_0$, $ADC_1$, $ADC_2$ and $ADC_3$ will be adjusted to ground voltage if ADC input signal is DC-free. On the other hand, the reference signal also could be other value provided by supply voltage or reference voltage generator according to the requirement of the time-interleaved analog-to-digital converter.

Please refer to the step size control unit 520 shown in FIG. 5, the step size control unit 520 is used to adjust the value of residue offset error calculated by adder 510. The output value of step size control unit 520 can be viewed as a scaled residue offset error, which reflects the direction or amplitude of the residue offset error. In one embodiment, the step size control unit 520 can be implemented by a multiplier as shown in FIG. 5, which multiplying the residue offset error with a step size u and outputting the step signal into the accumulator 530. Therefore, it can be realized that the step size u can be arbitrarily adjusted at any moment of calibration process or implemented by a pre-defined function of time to improve the calibration speed and accuracy of time-interleaved ADC. On the other hand, the step size control unit 520 can be implemented by signed least-mean-square adaptation method, that is, when the output ($\overline{Vi}-\overline{V_0}$) of the adder 510 is a positive value, the step size control unit 520 will output a positive step signal u. On the contrary, when the output ($\overline{Vi}-\overline{V_0}$) of the adder 510 is a negative value, the step size control unit 520 will output a negative step signal –u.

Accordingly, please refer to the gain error estimating module 330 shown in FIG. 3, the gain error estimating module 330 comprises an absolute value calculating module 323, an accumulating and averaging module 324, and a least-mean-square module 325. The absolute value calculating module 323 performs the function of absolute value calculation. Accumulating and averaging module 324 is the same with accumulating and averaging module 321 as calculating the average value of ADCi for each L samples signal block after the absolute value calculation. And the least-mean-square module 325 is used to estimate the gain error according to the average value |$\overline{Vi}$| and reference signal |$\overline{V_0}$|.

In this embodiment, the structures of the accumulating and averaging module 324 and the least-mean-square 325 are respectively the same with above-mentioned accumulating and averaging module 321 and least-mean-square 322. Therefore, the further illustrations are thus omitted here. The difference between gain error estimating module 330 and offset error estimating module 320 is that the accumulating and averaging module 324 and the least-mean-square module 325 are dealing with the absolute signal. This is because the meaning of "gain" is to amplify the signal in a predetermined ratio. Therefore, the absolute value calculation should be firstly performed such that the output of accumulating and averaging module 324 can reflect the amplitude of sampled signal and the output of the least-mean-square module 325 can reflect the gain error between $ADC_1$ and $ADC_0$.

Similarly, the least-mean-square module 325 is also a feedback circuit for estimating the gain error of $ADC_i$ according to the average of the absolute signals |$\overline{Vi}$| and reference signal | $\overline{V_0}$| (In this embodiment, i=1). As the structure of least-mean-square module 322, the least-mean-square module 325 would have an adder (or subtractor) for calculating the residue gain error by subtracting reference signal |$\overline{V_0}$| from the average value |$\overline{Vi}$|; a step size control unit for scaling the calculated residue gain error; and an accumulator for continuously accumulating the residue gain error. Therefore, when the average value |$\overline{Vi}$| is substantially equal to the reference signal |$\overline{V_0}$|, the residue error calculated by adder 510 in least-mean-square module 325 would be approaching or equal to zero. That is, the estimated gain error of $ADC_1$ is approaching or equal to the true gain error between $ADC_1$ and $ADC_0$. It is noticed that the estimated gain error would continuously be transmitted to error correction module 310 during entire calibration process.

Moreover, the operation of the calibration module 232-238 can be divided into two calibration modes, the foreground calibration mode and the background calibration mode. The foreground calibration represents the calibration is performed on the ADCs $ADC_0$-$ADC_3$ before the entire system starts to work. On the other hand, the background calibration represents that the calibration is continuously performed on the ADCs $ADC_0$-$ADC_3$ after the entire system starts to work and during full ADC on-line normal operation. In addition, it can be realized that the calibration modules 222-228 perform the offset error calibration at first, and then perform the gain error calibration.

Figure 6:
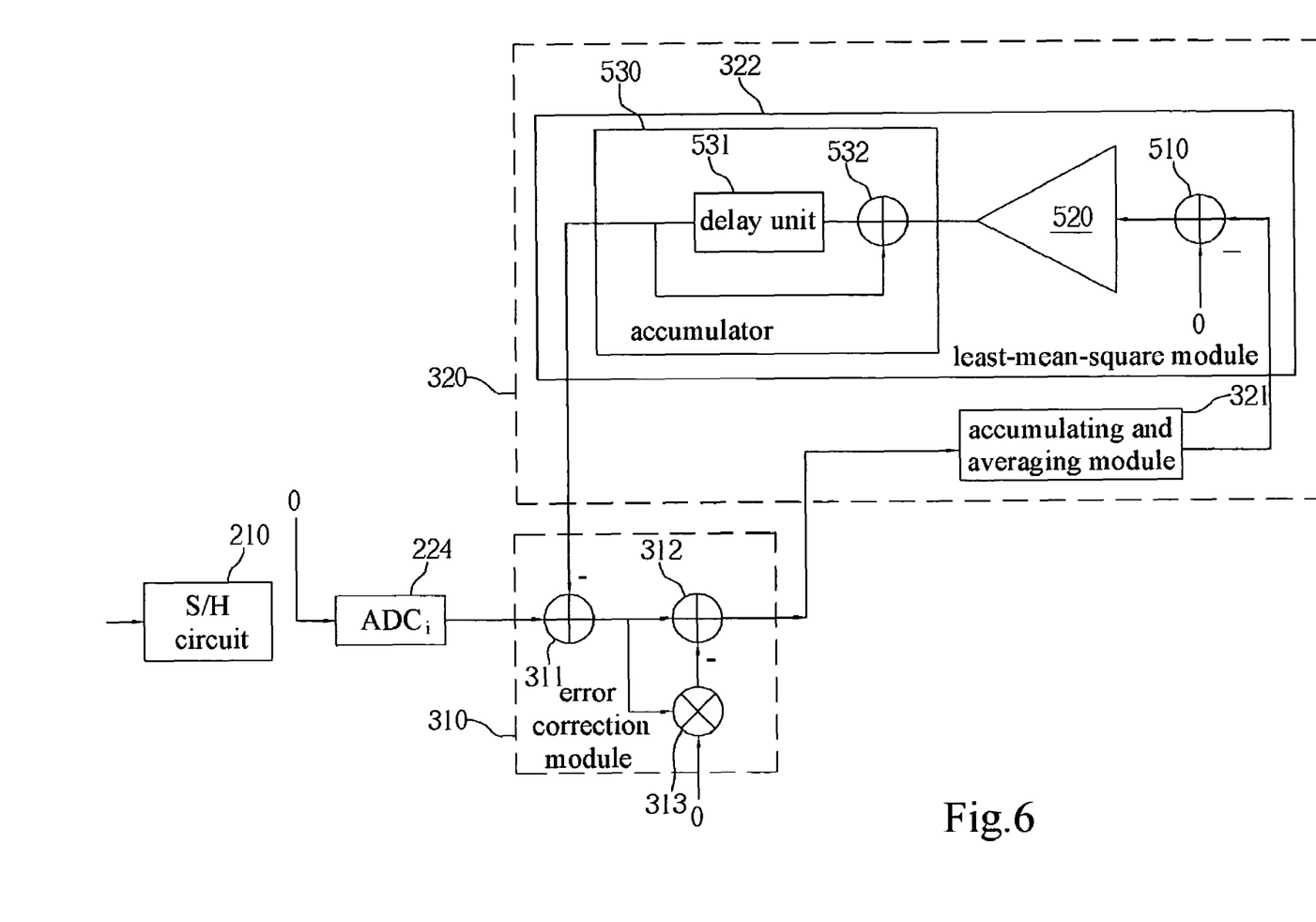
FIG. 6 is a diagram when the ADC and the calibration module perform the foreground offset error calibration.

Please refer to FIG. 6, which shows a diagram of $ADC_1$ and calibration module 234 performing the offset error calibration during foreground calibration mode. As shown in FIG. 6, when the foreground offset error calibration is being performed, only the offset error estimating module 320 is activated (that is, the gain error estimating module 330 is temporarily stopped and the gain error transmitted to the multiplier 313 is set to 0). Furthermore, in order to correctly estimate the offset error, the part of $ADC_1$ output value influenced by the gain of $ADC_1$ should be firstly removed. Therefore, in this embodiment, the signal inputted into the $ADC_1$ should be set to 0 (ground voltage). Then the signal part influenced by the gain of $ADC_1$ can be ignored. In other words, the $ADC_1$ output is equal to $ADC_1$ offset error. Therefore, the offset error estimating module 320 and the error correction module 310 can perform the above mentioned least-mean-square adaptive operation to calibrate the offset error of $ADC_1$.

Figure 7:
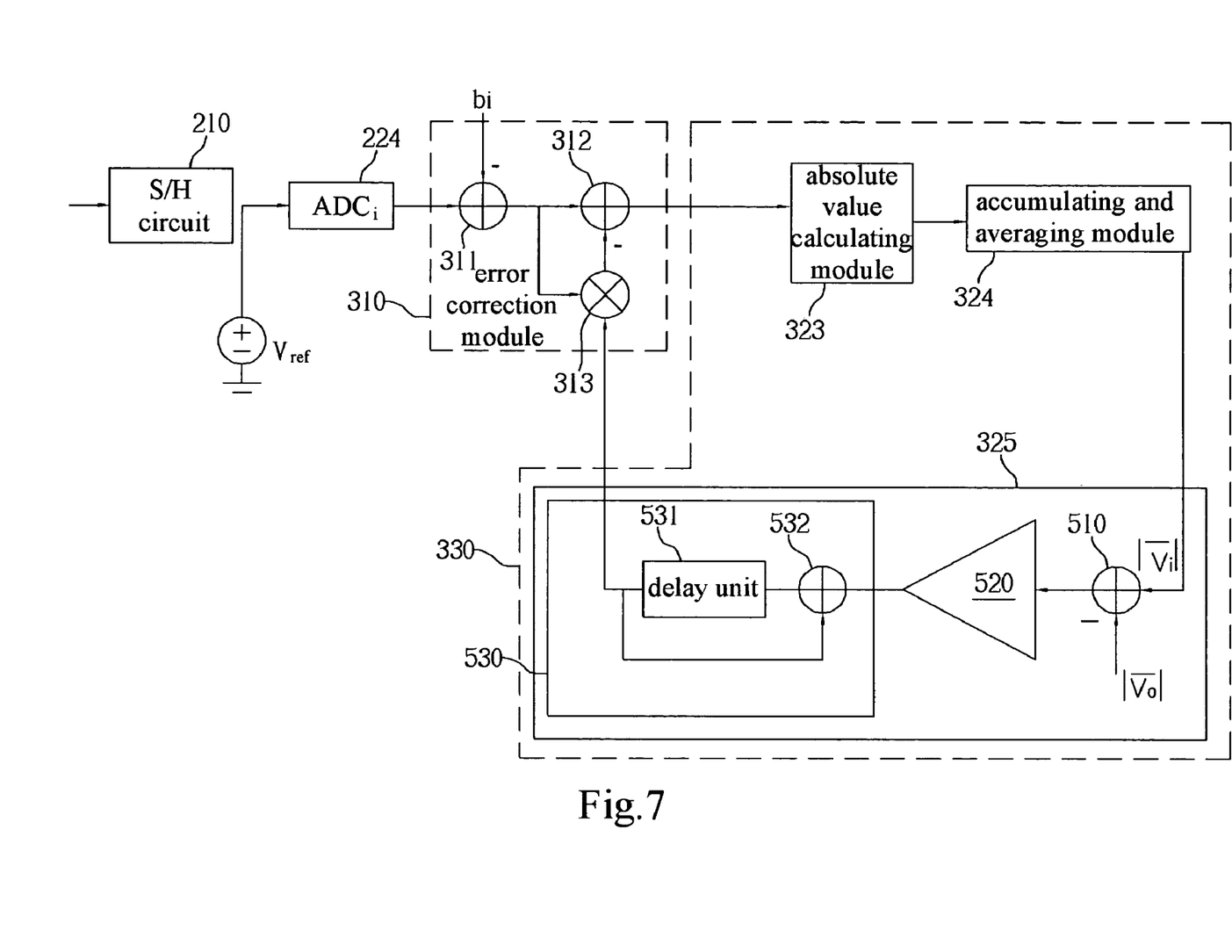
FIG. 7 is a diagram when the ADC and the calibration module perform the foreground gain error calibration.

Please refer to FIG. 7, which shows a diagram of $ADC_1$ and calibration module 234 performing the gain error calibration at the time of foreground calibration. As shown in FIG. 7, when the gain error calibration is being performed, there would be an input reference voltage $V_{ref}$ transmitted into the $ADC_1$ and the gain error estimating module 330 is activated. Please note that, because the offset error $b_i$ (in this embodiment, i=1) inputted into adder 311 has been estimated by offset error estimating module 320 through the above mentioned offset error calibration method, there is almost no offset error $b_1$ of $ADC_1$ contained in the signal inputted into the adder 312 and the multiplier 313. Therefore, the gain error estimating module 330 can correctly estimate the gain error $a_1$ of $ADC_1$ without influencing by offset error of $ADC_1$. Accordingly, as mentioned above, the gain error estimating module 330 utilizes the least-mean-square adaptive algorithm to estimate the gain error $a_1$ of $ADC_1$ and generates estimated gain error $a_1$ of $ADC_1$ to the error correction module 310, and then the error correction module 310 will continuously calibrate the gain error $a_1$ of $ADC_1$ according to the estimated gain error estimated by gain error estimating module 330. After a period of time, when the residue gain error of $ADC_1$ is approaching or equal to zero, that is, the gain error $a_1$ of $ADC_1$ has be correctly estimated and calibrated by the error correction module 310 and error estimating module 320.

Figure 8:
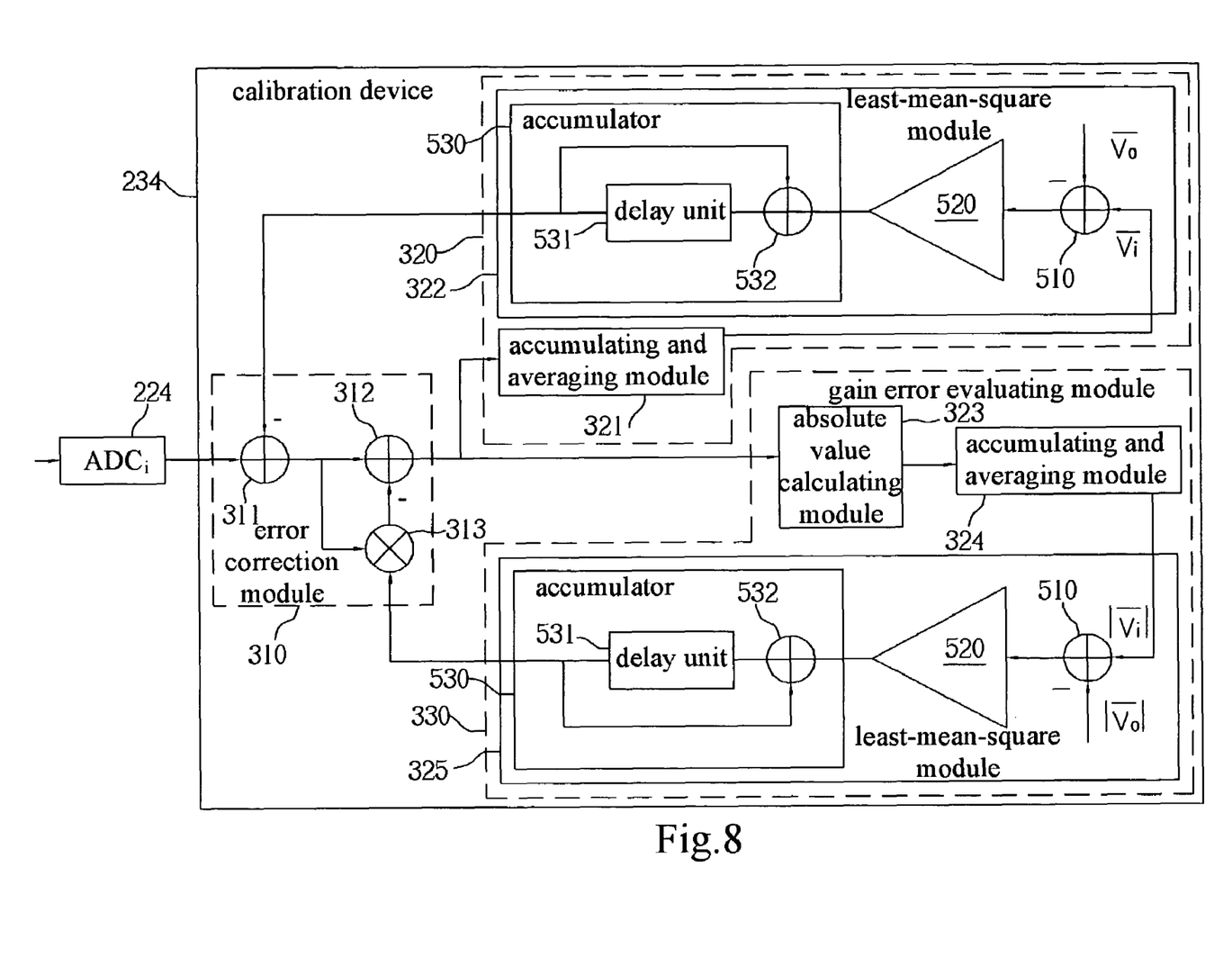
FIG. 8 is a diagram when the ADC and the calibration perform the background calibration.

After the foreground calibration procedure, the time-interleaved ADC 200 enters the procedure of background calibration. Please refer to FIG. 8, which shows a diagram of calibration module 234 operated under background calibration mode. As shown in FIG. 8, when the calibration module 234 is operated under the background calibration mode, the offset error estimating module 320 and the gain error estimating module 330 are operated simultaneously or alternatively to continuously calibrate and track the $ADC_1$ offset error and the gain, and their drifting too. Please note that, the gain error and the offset error of $ADC_1$ estimated under the foreground calibration mode are utilized to be the initial values of the gain error and the offset error in the background calibration. From FIG. 8, the detail operation and function of offset error estimating module 320, gain error estimating module 330 and error correction module 310 have been clearly introduced in above, hence some repeated introduction about these circuits are omitted here.

Please note that, although the present invention uses a time interleaved ADC with four sub-ADCs to be an embodiment. But in the actual implementation, the time interleaved ADC could contain more or less sub-ADCs rather than only limited in four sub-ADCs. In addition, the digital circuits of the accumulator, the adder, and the error correction module are not limited to the above-mentioned structures. Those skilled in the art can utilize other circuits, which can provide the same function, to replace the digital circuits of these devices. This change also obeys the spirit of the present invention.

Furthermore, in the above mentioned embodiment, the calibration module 232-238 of the time-interleaved ADC 200 comprises an offset error estimating module and a gain error estimating module. However, this is also regarded as an embodiment, not a limitation of the present invention. The calibration module 232-238 can only comprise an offset error estimating module or a gain error estimating module.

While certain exemplary embodiments have been described and shown in the accompanying drawings, it is to be understood that such embodiments are merely illustrative of and not restrictive on the broad invention, and that this invention should not be limited to the specific construction and arrangement shown and described, since various other modifications may occur to those ordinarily skilled in the art.

What is claimed is:

1. A calibration device for calibrating an error of an analog-to-digital converter, the calibration device comprising:
    an error estimating module comprising:
        a filter, receiving L digital signals relative to the analog-to-digital converter, for calculating a mean value of the L digital signals to generate a filtered signal, wherein the L is greater than 1; and
        a least-mean-square module, coupled to the filter, for performing a least-mean-square operation on the filtered signal to generate an estimated error corresponding to the digital signal; and
    an error correction module, coupled to the error estimating module, for calibrating the error of the analog-to-digital converter according to the estimated error.

2. The calibration device of claim 1, wherein the filter comprises:
    an accumulator, for accumulating the digital signal to generate an accumulated signal; and
    an averaging module, coupled to the accumulator, for averaging the accumulated signal to generate the filtered signal.

3. The calibration device of claim 1, wherein the least-mean-square module comprises:
    a calculating unit, for calculating a difference between the filtered signal and a reference signal;
    a step size control module, for outputting a corresponding step signal according to the difference; and
    an accumulator, for accumulating the step signal to output the estimated error.

4. The calibration device of claim 3, wherein the reference signal is substantially equal to zero.

5. The calibration device of claim 3, wherein the reference signal corresponds to the mean value of a plurality of output signals generated from another analog-to-digital converter.

6. The calibration device of claim 1, being utilized in a time-interleaved ADC.

7. The calibration device of claim 1, wherein the error estimating module comprises:
    an offset error estimating module for estimating an offset error of the analog-to-digital converter, wherein the estimated error is an estimated offset error.

8. The calibration device of claim 7, wherein the error estimating module comprises:
    a gain error estimating module for estimating a gain error of the analog-to-digital converter, wherein the estimated error comprises the estimated offset error and an estimated gain error.

9. The calibration device of claim 8, wherein the error correction module comprises:
    a first adder, for correcting the offset error of the analog-to-digital converter according to the estimated offset error; and
    a second adder, for correcting the gain error of the analog-to-digital converter according to the estimated gain error.

10. The calibration device of claim 1, wherein the error estimating module comprises:
    a gain error estimating module for estimating a gain error of the analog-to-digital converter, wherein the estimated error is an estimated gain error.

11. The calibration device of claim 1, being performed in a foreground calibration mode or performed in a background calibration mode.

12. The calibration device of claim 11, wherein the gain error estimating module comprises:
    an absolute value calculating module, receiving the digital signal relative to the analog-to-digital converter, for performing an absolute value calculation on the digital signal to obtain an absolute signal, and outputting the absolute signal to the filter.

13. A calibration device for calibrating an error of an analog-to-digital converter, the calibration device comprising:
    a filter, receiving L digital signals relative to the analog-to-digital converter, for calculating a mean value of the L digital signals to output a filtered signal, wherein the L is greater than 1;
    a calculating unit, coupled to the filter, for calculating the difference between the filtered signal and a reference signal to generate a residue error;
    an accumulator, coupled to the calculating unit for accumulating the residue error to generate an estimated error; and
    an error correction module, coupled to the accumulator, for correcting the error of the analog-to-digital converter according to the estimated error.

14. The calibration device of claim 13, wherein the calculating unit further comprises:
    a step size control unit, for scaling the difference between the filtered signal and the reference signal with a scaling value and generating the residue error.

15. The calibration device of claim 14, wherein the scaling value varies with time.

16. The calibration device of claim 14, wherein the scaling value corresponds to the residue error.

17. The calibration device of claim 13, wherein the reference signal is a mean value of a plurality of digital signals generated from another analog-to-digital converter.

18. The calibration device of claim 13, wherein the error is offset error or gain error of the analog-to-digital converter.

19. The calibration device of claim 13, further comprises:
    an absolute value calculating module, receiving the digital signal, for performing an absolute value calculation on the digital signal to obtain an absolute digital signal, and outputting the absolute digital signal to the filter.

20. The calibration device of claim 13, being performed in a foreground calibration mode or performed in a background calibration mode.

21. A method for calibrating an error of an analog-to-digital converter, the method comprising:
    calculating a mean value of L digital signals relative to the analog-to-digital converter to output a filtered signal, wherein the L is greater than or equal to 1;
    calculating the difference between the filtered signal and a reference signal to generate a residue error;

accumulating the residue error to generate an estimated error; and correcting the error of the analog-to-digital converter according to the estimated error.

22. The method of claim 21, further comprising:

scaling the difference between the filtered signal and the reference signal with a scaling value to generate the residue error.

23. The method of claim 22, wherein the scaling value varies with time.

24. The method of claim 21, wherein the reference signal is a mean value of a plurality of digital signals generated from another analog-to-digital converter.

25. The method of claim 21, wherein the error is offset error or gain error of the analog-to-digital converter.

* * * * *